United States Patent
Shinkai et al.

(10) Patent No.: US 7,289,544 B2
(45) Date of Patent: Oct. 30, 2007

(54) OPTICAL MODULE

(75) Inventors: Jiro Shinkai, Yokohama (JP); Takashi Kato, Yokohama (JP); Toshio Takagi, Yokohama (JP); Hiroyuki Yabe, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 226 days.

(21) Appl. No.: 10/992,291

(22) Filed: Nov. 19, 2004

(65) Prior Publication Data

US 2005/0069001 A1    Mar. 31, 2005

Related U.S. Application Data

(63) Continuation-in-part of application No. 10/247,816, filed on Sep. 20, 2002, now Pat. No. 6,836,490.

(30) Foreign Application Priority Data

Sep. 20, 2001   (JP)   ............... 2001-287778

(51) Int. Cl.
*H01S 3/13* (2006.01)
(52) U.S. Cl. ............... 372/29.02; 372/29.011; 372/38.01; 372/32; 372/29.021
(58) Field of Classification Search ............ 372/29.02, 372/32, 38.01, 29.011, 29.021
See application file for complete search history.

(56) References Cited

U.S. PATENT DOCUMENTS

| | | | |
|---|---|---|---|
| 5,825,792 A | 10/1998 | Villeneuve et al. | ............ 372/32 |
| 6,046,813 A | 4/2000 | Naganuma | |
| 6,151,114 A | 11/2000 | Russell | |
| 6,345,060 B1 | 2/2002 | Copner et al. | |
| 6,366,592 B1 | 4/2002 | Flanders | |

(Continued)

FOREIGN PATENT DOCUMENTS

JP    2000-315833    11/2000

(Continued)

OTHER PUBLICATIONS

Copending U.S. Appl. No. 10/247,818, filed Sep. 20, 2002, entitled Light-Emitting Module.

(Continued)

*Primary Examiner*—Minsun Oh Harvey
*Assistant Examiner*—Delma R. Flores Ruiz
(74) *Attorney, Agent, or Firm*—Smith, Gambrell & Russell, LLP

(57) ABSTRACT

The object of the present invention is to provide an optical module for the WDM communication system, in which the oscillation wavelength is on the grid of the WDM regulation, moreover the optical output power and the oscillation wavelength can be controlled independently. The present module comprises a semiconductor light-emitting device, a wedge shaped etalon device and two light-receiving devices. The etalon device contains a first portion, on which the anti-reflection films are coated, and a second portion. One of the receiving devices detects light transmitted through the first portion of the etalon device, while the other device detects light through the second portion. Signal from the former device controls the output power of the light-emitting device, while the signal from the latter receiving device controls the oscillation wavelength of the laser.

13 Claims, 11 Drawing Sheets

U.S. PATENT DOCUMENTS

| | | |
|---|---|---|
| 6,487,027 B2 * | 11/2002 | Yamauchi et al. .......... 359/820 |
| 6,488,419 B2 | 12/2002 | Kato et al. |
| 6,526,079 B1 | 2/2003 | Watterson et al. |
| 6,788,724 B2 * | 9/2004 | Sell et al. ..................... 372/92 |
| 6,836,490 B2 * | 12/2004 | Shinkai et al. ................ 372/36 |
| 6,888,857 B2 * | 5/2005 | Takagi et al. ................. 372/32 |
| 2001/0022793 A1 | 9/2001 | Yokoyama |
| 2002/0018627 A1 | 2/2002 | Kato et al. |
| 2002/0048299 A1 | 4/2002 | Hyuga et al. |
| 2002/0159488 A1 * | 10/2002 | Wolak et al. ................. 372/36 |
| 2003/0039276 A1 * | 2/2003 | Tatsuno et al. ............... 372/31 |

FOREIGN PATENT DOCUMENTS

| | | |
|---|---|---|
| JP | 2001-284711 | 10/2001 |
| WO | WO95/20144 | 7/1995 |

OTHER PUBLICATIONS

Copending U.S. Appl. No. 10/247,817, filed Sep. 20, 2002, entitled Optical Module.

* cited by examiner

OPTICAL MODULE

CROSS REFERENCE RELATED APPLICATIONS

This is a continuous-in-part of patent application of Ser. No. 10/247,816, now U.S. Pat. No. 6,836,490 filed on Sep. 20, 2002, the entire disclosure of which is incorporated herein by reference. This application contains subject matter related to the subject matter of the following applications, which are assigned to the same assignee as this application and filed on the same day as the original application above. The below listed applications are incorporated herein by reference in its entirely:

Ser. No. 10/247,817, entitled "Light-Emitting Module" by Takagi et. al, and Ser. No. 10/247,818, "Light-Emitting Module" by Yabe et. al.

BACKGROUND OF THE INVENTION

1. Field of Invention

This invention relates to an optical module, especially relates to an optical signal source used in a WDM (Wavelength Division Multiplexing) communication.

2. Related Prior Art

In the WDM communication, the wavelength interval to the adjacent channel is defined to be 0.8 nm. This regulation means that the absolute accuracy superior than ±/−0.1 nm is required for the signal wavelength of respective channel. A semiconductor laser, such as DFB laser diode (Distributed Feedback Laser) and DBR (Distributed Bragg Reflector), is utilized for the signal source of the WDM system.

These feedback lasers have a sharp oscillation spectrum with a typical bandwidth less than 50 GHz. However, since the Bragg grating formed within a laser diode chip solely determines the oscillation wavelength, it would be quite difficult to get the desired wavelength due to the uncertainty of the manufacturing process parameter.

It is also known that the oscillation wavelength of individual lasers can be adjusted by the feedback control after the completion of the production. The method is: 1) dividing the output light from the optical module, 2) monitoring the divided light with a spectrum analyzer, and 3) adjusting the temperature of the laser diode and the injection current to the laser, thus controlling the oscillation wavelength. However, this technique uses the optical spectrum analyzer and is quite impossible to apply to the WDM system, which requires a plurality set of such large-scale equipment for respective optical signal source.

Another example is disclosed in U.S. Pat. No. 5,825,792, in which a parallel plates etalon device is used for the controlling of the oscillation wavelength. In the '792 patent, two optical detectors monitor a divergent light emitted from the back facet of the laser diode through the etalon device placed with an angle for the light. By feed backing the differential signal of two detectors to a temperature of the laser, the oscillation wavelength is effectively adjusted. This method realizes the precisely controlled oscillation wavelength, but requires a precisely adjustment of the rotational angel of the etalon device to the divergent light beam of the laser.

SUMMARY OF THE INVENTION

The object of the present invention is to provide a light-emitting module that enables to control both of the oscillation wavelength and the optical output power with high accuracy within a compact sized housing.

A light-emitting module according to the present invention comprises a first optical detector for monitoring a light from the semiconductor laser diode not through an etalon device and a second optical detector for monitoring light from the laser diode through the etalon device. The light through the etalon device reflects optical properties both of the laser diode and the etalon device, while the light not through the etalon device merely shows the properties of the laser. The optical property of the etalon device depends on a thickness and shows the transmittance with a periodicity.

Another aspect of the invention is that the etalon device has a first portion on which an anti-reflection film is coated and a second portion. Light transmitted through the first portion does not show a periodic behavior based on the thickness of the etalon device and merely reflects the characteristic of the laser. On the other hand, light through the second portion on which any anti-reflection film is provided has periodic characteristics reflecting the etalon device and the laser.

The fluctuation of the oscillation wavelength of the laser diode appears as a phase shift of the periodic characteristic of light transmitted through the etalon device. Therefore, by monitoring light through the etalon device, the just present oscillation wavelength is detected and by monitoring light not through the etalon device, the present power of the laser diode is obtained.

In the invention, it is preferable to split light from the laser diode before the etalon device and to detect split light for monitor light not through the etalon device. The light splitting device can locate either in the front side of the laser diode or the backside of the laser.

It is further preferable to place a lens between the laser diode and the etalon device for converting divergent light from the laser diode into a collimated light. Moreover, by using a wedge shape etalon device, the oscillating wavelength of the laser diode can be selected merely sliding the etalon device along a direction normal to the optical axis.

The present invention provides a thermoelectric cooler for adjusting temperature of the laser. The temperature is controlled by the signal from the detector that monitors light through the etalon device, thus defines the oscillation wavelength.

The invention may also provide an adjusting circuit of the output optical power of the laser. The signal from the detector that monitors light not through the etalon device can maintains the output power of the laser.

BRIEF DESCRIPTION OF DRAWINGS

FIG. 2 is a cross sectional view showing the primary assembly of the

DETAILED DESCRIPTION OF THE INVENTION

The preferred embodiments of the optical module will be described in referring to drawings. In the description, elements identical to each other will be referred to with numerals identical to each other without their overlapping explanations.

Figure 1:
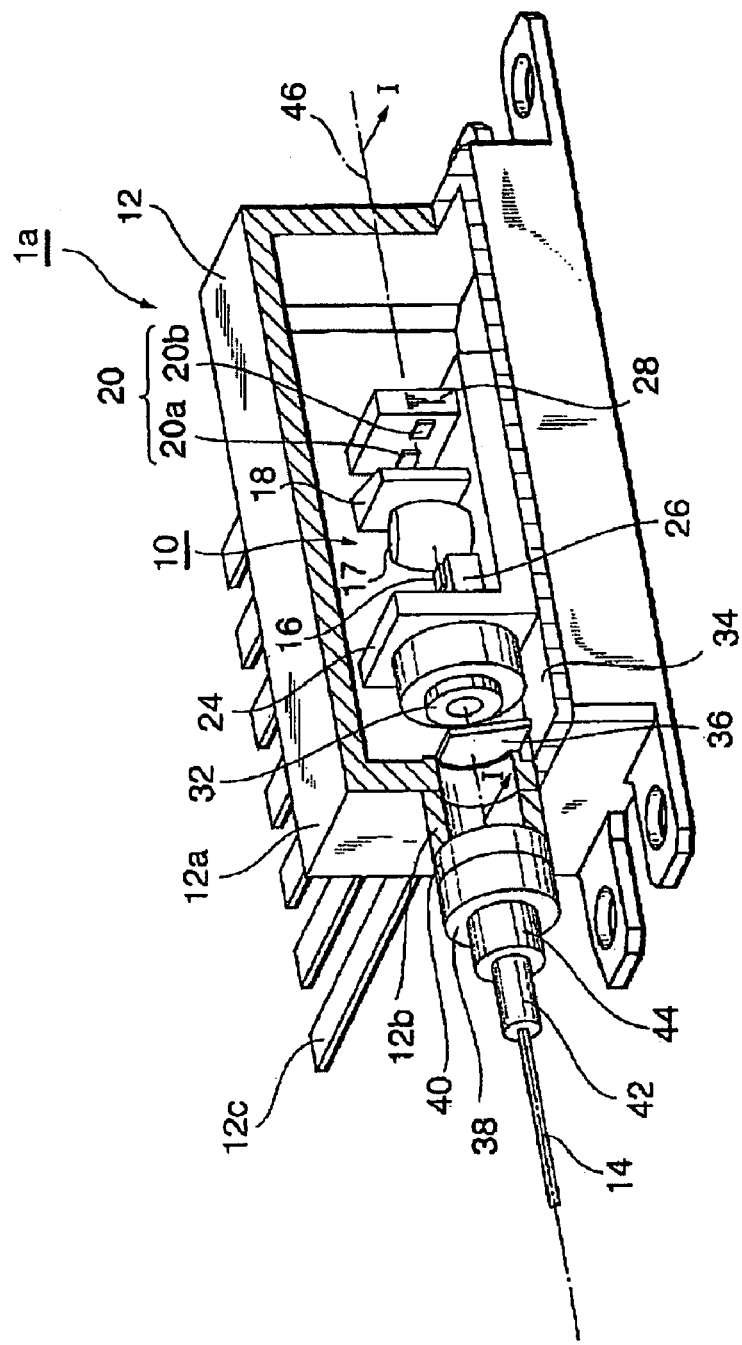
FIG. 1 is a perspective view showing the module.
Figure 2:
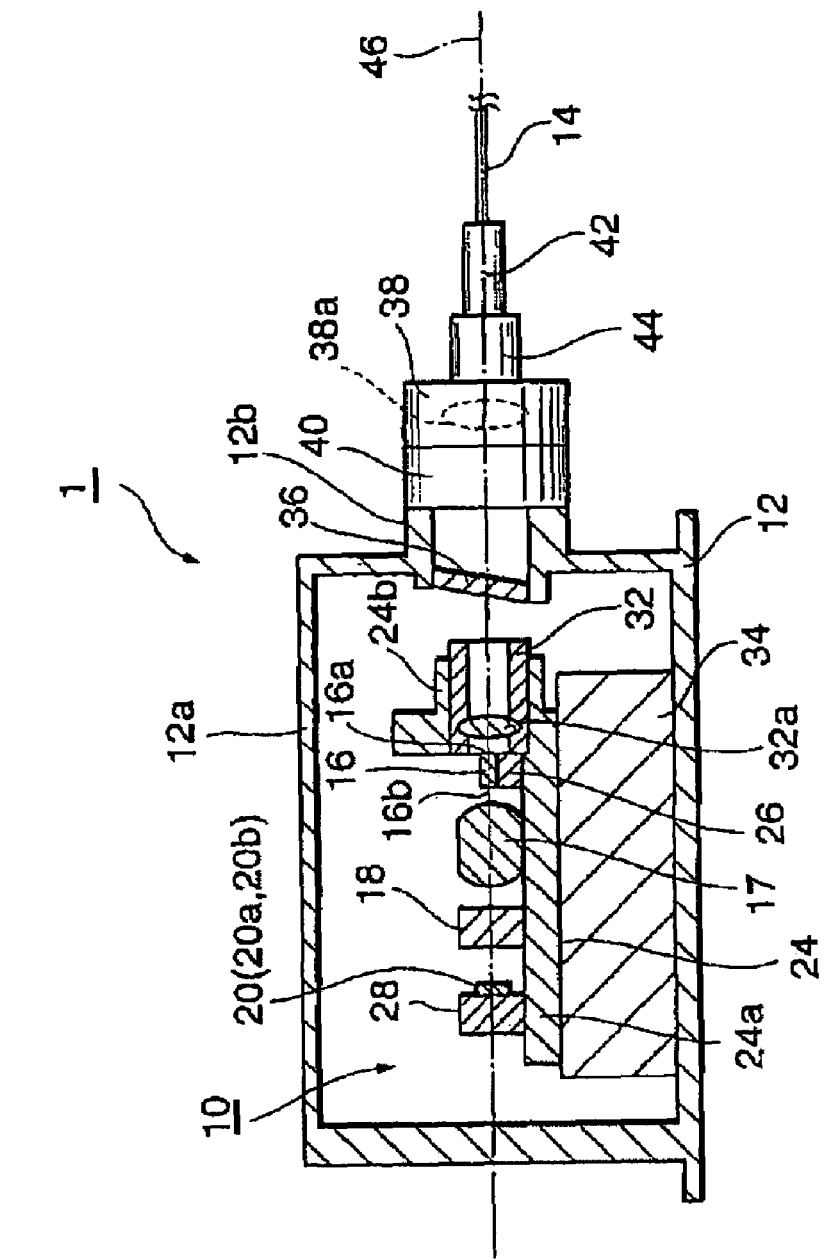

FIG. 1 is a perspective view showing the laser diode module of the present invention and FIG. 2 is a cross sectional viewing of the module.

The module comprises a primary assembly 10 and housing 12 containing the assembly 10 therein. The primary assembly 10 is placed on the base plate of the housing and sealed with an inert gas such as dry nitrogen in the housing. The housing 12 comprises a body 12a, a cylinder 12b guiding an optical fiber into the primary assembly and a plurality of leads 12c.

The primary assembly 10 contains a laser diode 16, auxiliary members 24, 26, 28 and a lens holder 32. Auxiliary members 24, 26, 28 mount the laser diode 16, a photodiode 18, and a lens 21, respectively. The auxiliary member 24 is placed on a thermoelectric cooler 34. The cooler 34 enables to control the temperature of the laser diode 16 by adjusting a supply current to the cooler. A Peltier element is a typical device for the cooler 34. The auxiliary member is made of material having a good thermal conductivity, such as Aluminum Nitride (AlN).

An opening sealed by a hermetic glass for coupling the primary assembly to the cylinder 12b is provided on one wall of the housing 12. Light emitted from the laser diode 16 is passing through the opening and entering one tip of an optical fiber 14. Another lens holder 38 is held at the edge of the cylinder 12b. An optical isolator 40 cutting the light propagating form the optical fiber 14 to the laser diode 16 is provided between the lens holder 38 and the cylinder 12b.

The optical fiber 14 is inserted at the edge of the cylinder 12b. A ferrule 42 covers the tips of the fiber 14. The lens holder 38 holds a sleeve 44. Inserting the ferrule 42 into the sleeve 44, the optical position of the ferrule to the housing 12 is defined. Thus, the fiber 14, the lens holder 38 and the primary assembly 10 are optically aligned with each other.

Referring to FIG. 2, the auxiliary member 24 comprises a device-mounting portion 24a and a lens-supporting portion 24b. The lens-supporting portion 24b provides an opening to secure the lens holder 32, in which a lens 32a to collimate light emitted from the laser diode 16 is inserted.

The laser diode 16 comprises a first facet 16a, a second facet 16b, and an active layer (a light-emitting layer) provided between the first and the second facet. The laser diode is placed on the auxiliary member 26. A pair of facet 16a and 16b of the laser diode 16 forms an optical cavity. Since the reflectivity of the first facet 16a is lower than that of the second facet 16b, it is enables to take out the light through the first facet 16a. The first facet 16a couples to the optical fiber 14 through lenses 32a and 38a. It is preferable to use the DFB laser diode (Distributed Feedback Laser) for the light-emitting device 16. However, a Fabry-Perott type laser diode is also applicable. On the first facet of the laser diode provides an anti-reflection coating, while a high-reflection coating is preferred to be on the second facet. A SiN (Silicon Nitride) and amorphous Si are used as coating materials.

An etalon device 18 is placed on the auxiliary member 24. One surface of the etalon device optically couples to the facet 16b of the laser, while the other surface of the etalon device couples to the photodiode 20, which contains a first light detector 20a and a second light detector 20b.

Figure 3A:
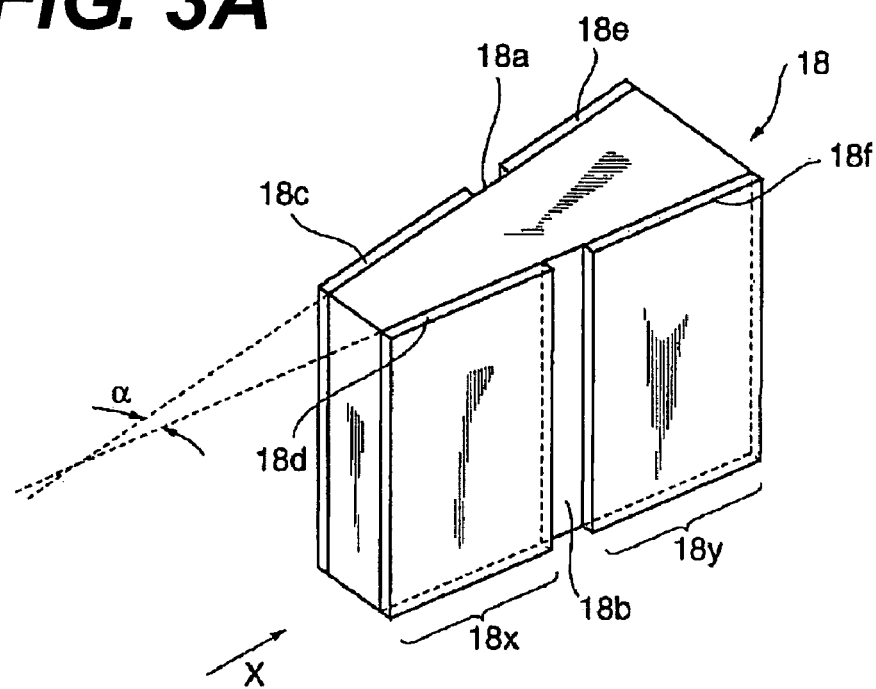
FIG. 3A and FIG. 3B show examples of the wedge etalon device.
Figure 3B:
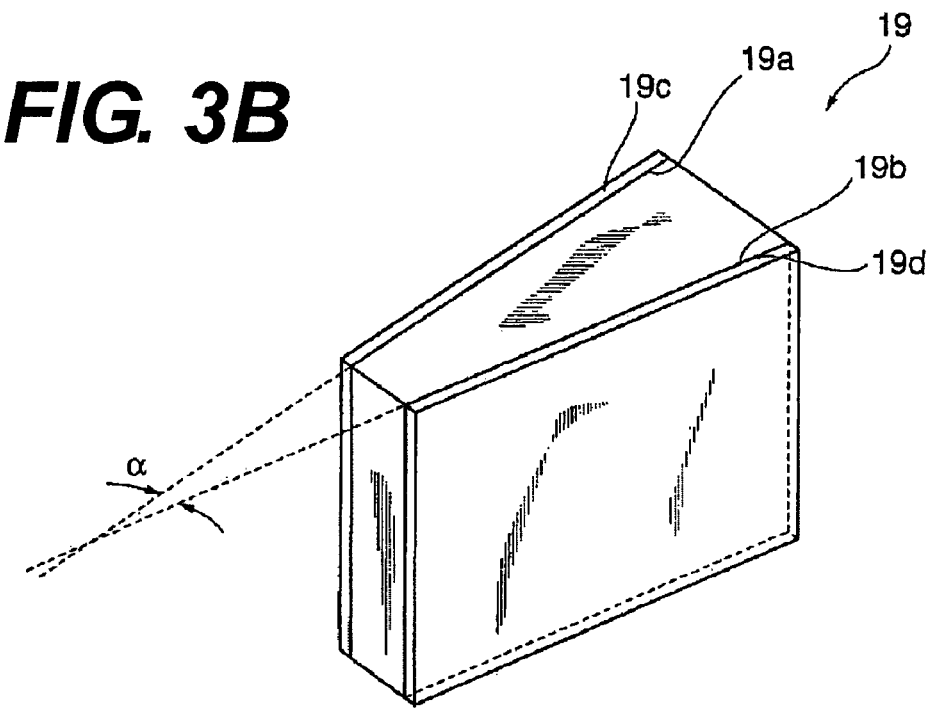

Next is an explanation of the etalon device as referring FIG. 3. As shown in FIG. 3, etalon devices (18, 19) have a pair of surface making an angle α with each other. The angle α is preferable to be greater than 0.01° and smaller than 0.1°. Etalon devices shown in FIG. 3A and FIG. 3B are wedge type etalon device. Only by sliding the wedge etalon device along the direction X, to which the surface is inclined, the locking wavelength of the laser diode module is adjusted. The wedge etalon device is usable compared to the parallel plate etalon device in this point of view.

In FIG. 3, the etalon device 18 comprises a light-entering surface 18a and a light-emitting surface 18b. The angle α between two surfaces is set so as to make multiple interference between the incident light from the surface 18a and the reflected light from the surface 18b. In another aspect, the etalon device 18 comprises a first portion 18x and a second portion 18y. The first portion has a reflective film 18c on the light-entering surface 18a and another reflective film 18d on the light-emitting surface. Also, the second portion 18y has anti-reflective films 18e and 18f on the light-entering surface 18a and the light-emitting surface 18b, respectively. The films 18e and 18f on the second portion 18y suppress the reflection at both surfaces so that the periodicity on the transmission spectrum due to multiple reflection at the surface of the etalon device disappears. Films (18c to 18f) on the surface are composed of multi layered materials.

FIG. 3B shows another example of the etalon device. This etalon device has two films (19c, 19d) on respective surfaces (19a, 19b). Both films adjust the reflectivity at respective surfaces so that the periodic characteristic of the transmittance of the etalon device may appear on the spectrum, which depends on the position X.

Figure 4A:
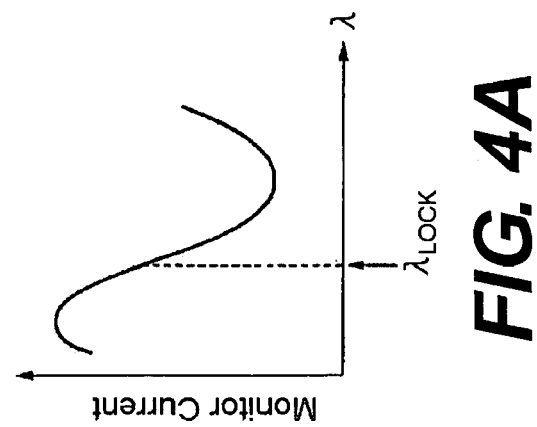
FIG. 4A is an exemplary diagram showing light signal not through the etalon device and FIG. 4B is a schematic diagram of an optical signal source for the WDM transmission using present optical module.
Figure 4B:
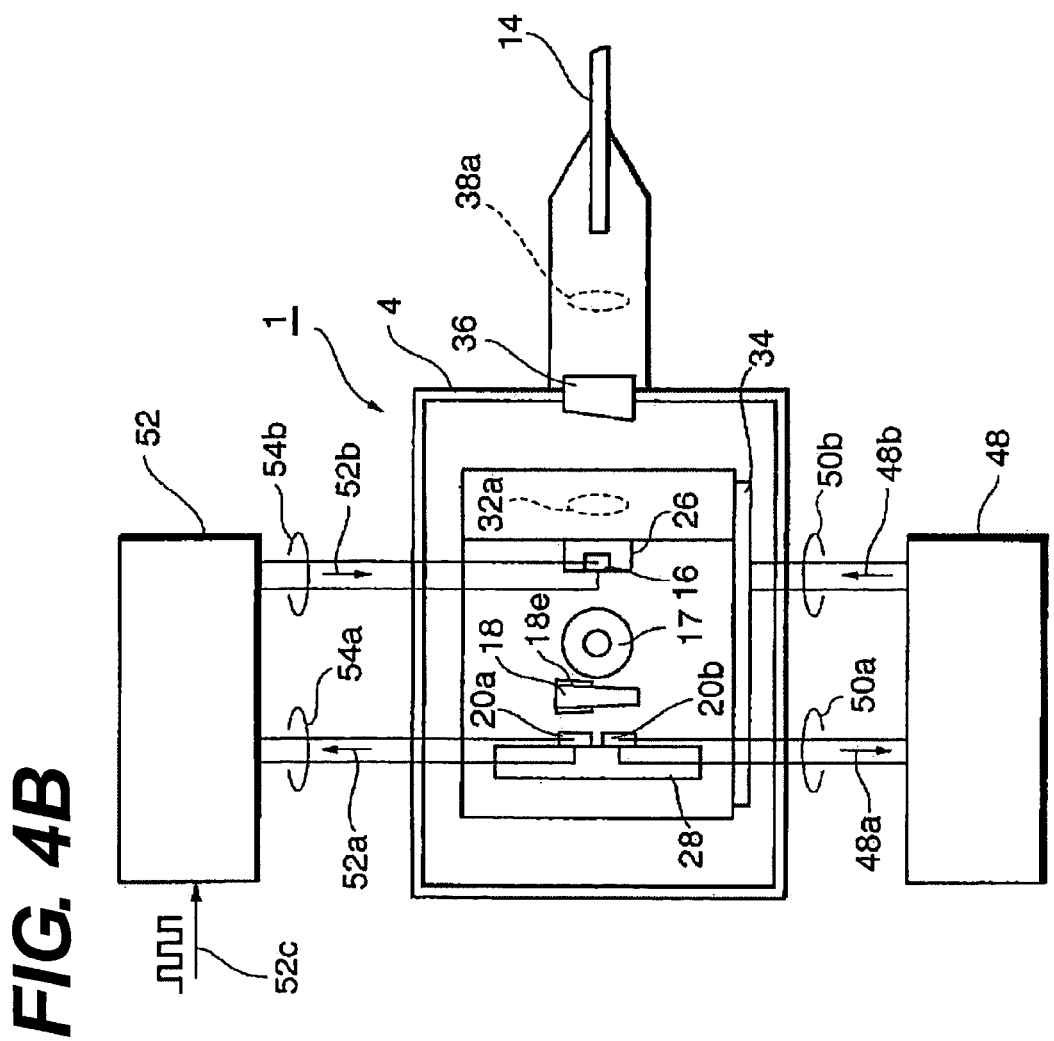

FIG. 4A shows a typical diagram obtained by the photo detector 20b. The horizontal axis denotes the wavelength of light emitted from the laser diode 16, while the vertical axis corresponds to the signal monitored by the detector 20b. FIG. 4B is a schematic diagram of a light source using the optical module of the present invention. The light source comprises a laser diode module 1, a first circuit block 48 for controlling the wavelength and a second circuit block 52 for controlling the optical power. The first block 48 couples to the detector 20b through the line 50a and also couples to the thermoelectric cooler 34 through the line 50b. The first block receives the signal from the detector 20b and outputs the driving signal for the cooler 34. The temperature of the cooler is adjusted by the driving signal so as to compensate the wavelength shift of the emitting light, accordingly.

Namely, when the wavelength of the laser diode shifts to shorter from $\lambda_{LOCK}$, the monitor current of the detector 20b increases. Responding to monitor current, the circuit 48 drives the cooler so that the laser diode 16 emits light with a longer wavelength. When the wavelength shifts to the longer side from the $\lambda_{LOCK}$, an a reverse control may occur.

The second block 52 couples to the photo detector 20a through the line 54a and the laser diode 16 through the line

54b. Receiving the monitored signal from the detector 20a, the block 52 drives the laser diode 16 so as to maintain the output power of the laser.

From FIG. 5 to FIG. 11 show various assemblies applicable to the present optical module.

FIRST EMBODIMENT

Figure 5A:
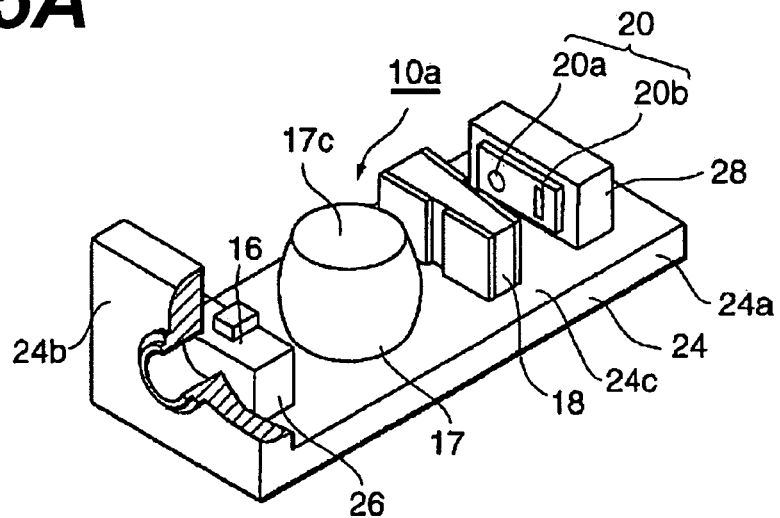
FIG. 5A is a perspective view showing an embodiment of the primary assembly.
Figure 5B:
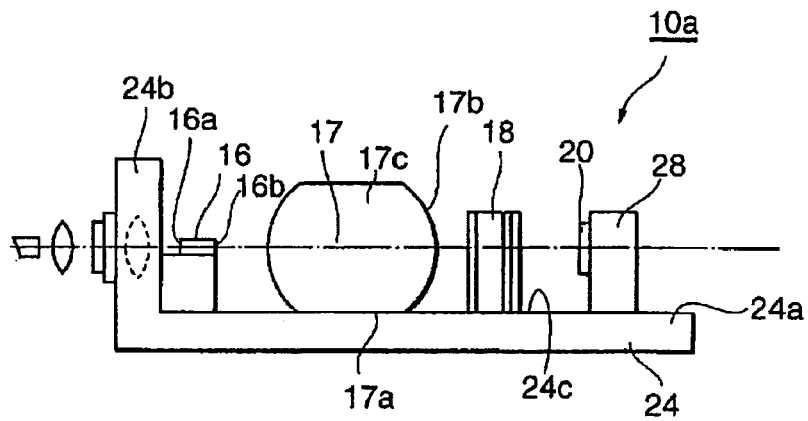
FIG. 5B is a side view and FIG. 5C is a plane view of the assembly showing in FIG. 5A.

In FIGS. 5A and 5B, the primary assembly 10a aligns the laser diode 16, the lens 17, the etalon device 18, and the photodiode 20 along the predetermined axis on the surface 24c. This embodiment provides the etalon device 18 of FIG. 3A, in which light transmitting through the second portion 18y does not show the periodic characteristics. The lens shapes a flat bottom surface 17a, a flat top surface 17c, and curved side surface 17b. The top of the lens is cut to be flat so as not to enter light reflected by the etalon device 18 into the laser diode 16, which results on a small sized package. Further, the flat bottom surface of the lens enables to assemble it directly on the auxiliary member 24a without any lens holder. The lens 32 and the lens holder 32a are not shown on the lens-supporting portion in FIG. 5A Two optical detectors 20a and 20b are arranged side by side on the photodiode 20. The detector 20a receives light transmitted through the second portion 18y of the etalon device, while the second detector 20b receives light from the first portion 18x of the etalon device. The width of the first detector 20a along the inclined direction of the etalon device is larger than that of the second detector 20b. The width of the second detector 20b along a direction normal to the inclined direction is larger than the width along the inclined direction. By this configuration, the sensitivity for the wavelength variation and the magnitude of light are enhanced.

Figure 5C:
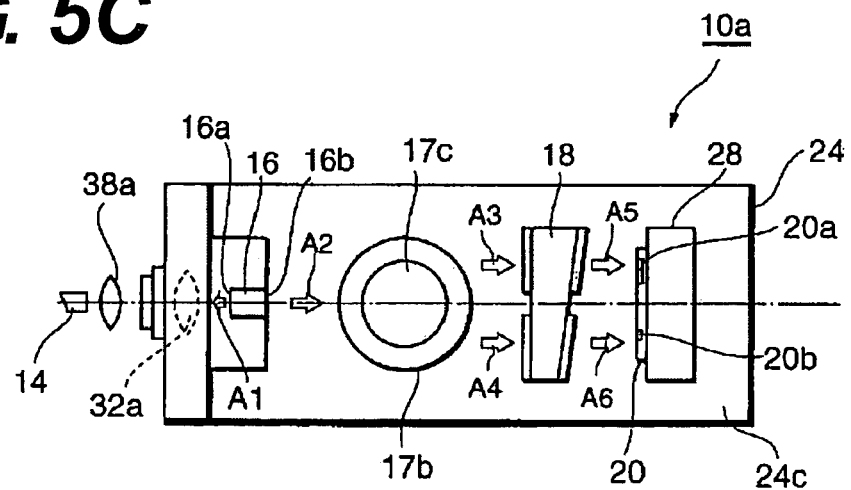

In FIG. 5C, a light beam A1 enters the optical fiber 14 through two lenses 32a and 28a. Another beam A2, emitted from another facet 16b of the laser diode 16, enters the lens 17. The lens 17 generates two beams A3 and A4 collimated with each other. The beam A3 reaches the detector 20a through the second portion 18y, in which the periodic characteristics do not appear. In this configuration, beams A3 and A4 reflect the spectrum of the laser diode 16, and also the beam A6 reflects the optical properties of the etalon device 18.

SECOND EMBODIMENT

Figure 6A:
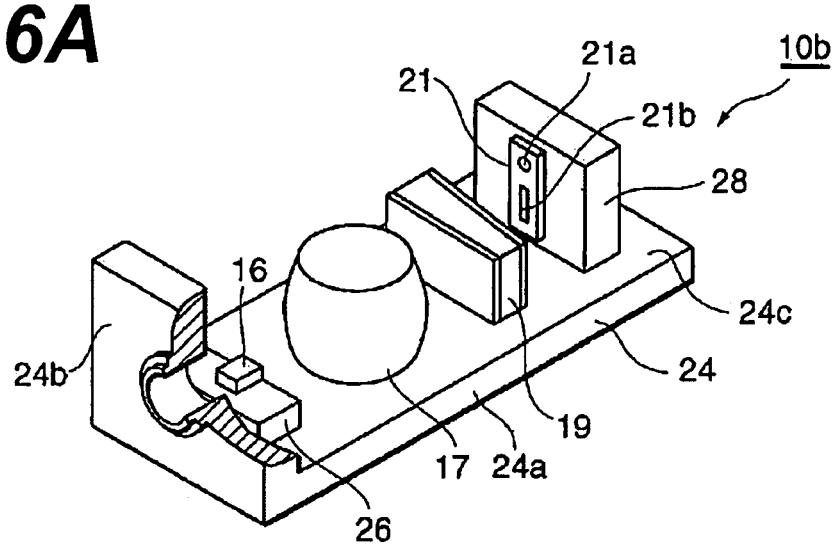
FIG. 6A is a view showing the second embodiment.
Figure 6B:
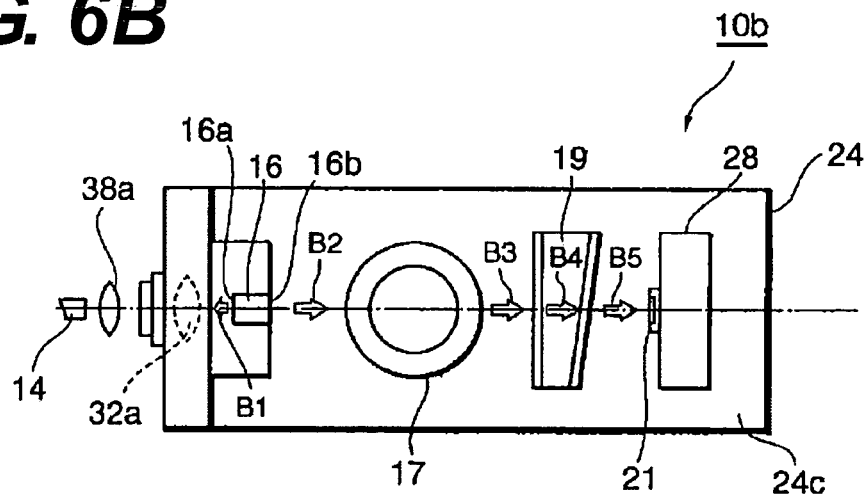
FIG. 6B is a plane view and FIG. 6C is the side view of the embodiment of FIG. 6.
Figure 6C:
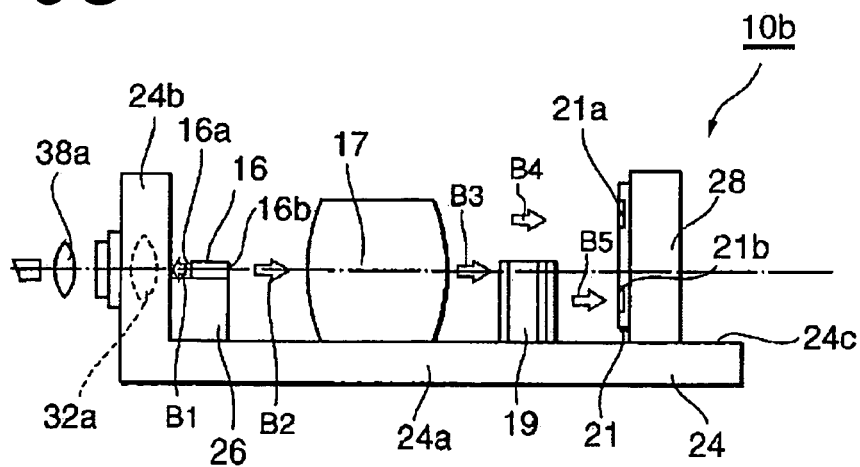

FIG. 6 shows the second embodiment of the invention, in which the etalon device of FIG. 3B is applied. The primary assembly 10b has a photodiode 21 replaced from the photodiode 20 in the first embodiment. The assembly 10b aligns the laser diode 16, the lens 17, the etalon device 19, and the photodiode 21 on the surface 24c along the predetermined axis. In this configuration, the detector 21a on the photodiode opposes the lens 17, while the detector 21b opposes the etalon device 19.

Detectors 21a and 21b have an up-and-down arrangement. The detector 21a receives light passing over the etalon device, while the detector 21b receives light passing through the etalon device. The shape of respective detectors is same as the first embodiment. The height of the etalon device 19 and the position of the first detector 21a are decided so that the detector 21a directly receives light from the lens 17. Further, the shape of lens 17 is also determined by the condition that the detector 21a directly receives light.

The light beam B1 from the facet 16a of the laser diode 16 enters the fiber 14 through a pair of lens 32a and 38a. Another beam B2 emitted from the facet 16b enters the lens 17. The lens 17 generates two collimated beams B3 and B4. The beam B4 directly enters the detector 21a without passing the etalon device. The portion of the beam B3 enters the etalon device and makes the beam B5 that reaches the detector 21b. The B4 involves the wavelength characteristic only of the laser diode 16, while the beam B5 reflects the characteristics both of the laser diode and the etalon device.

THIRD EMBODIMENT

Figure 7A:
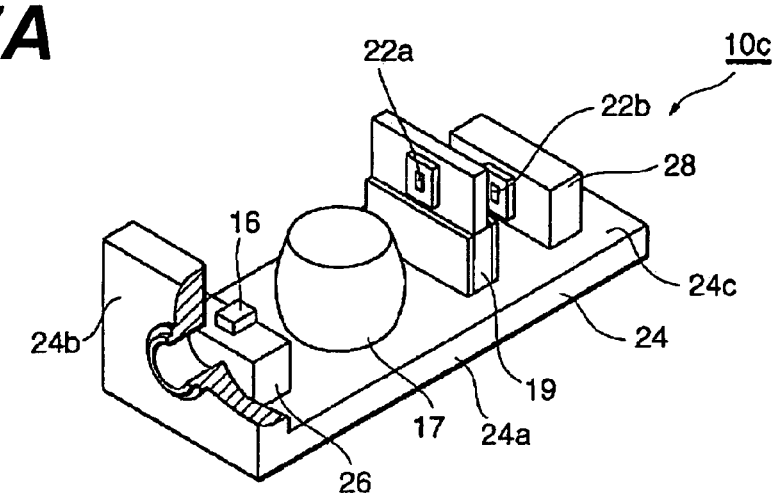
FIG. 7A is a view showing the third embodiment of the invention.
Figure 7B:
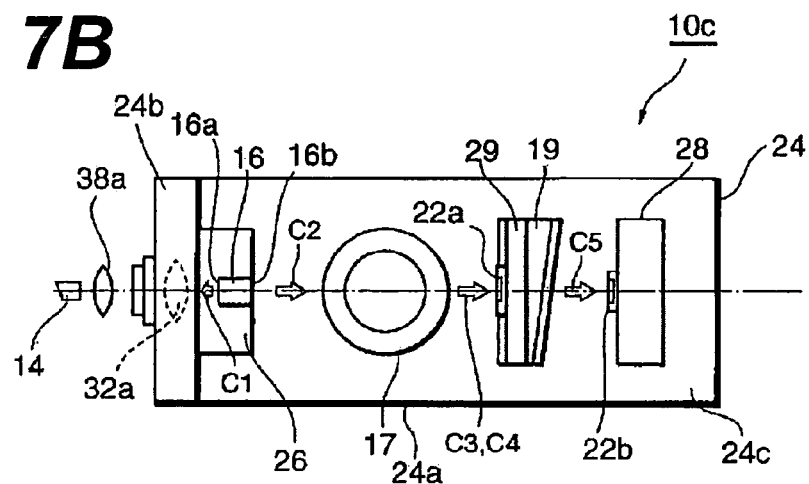
FIG. 7B is a plane view and FIG. 7C is a side view of the embodiment.
Figure 7C:
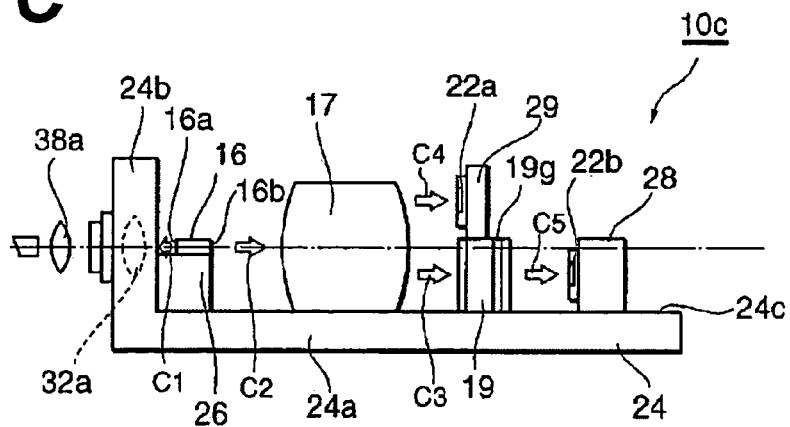

FIG. 7 shows the third embodiment of the invention. In this embodiment, the photodiode has detectors 22a and 22b instead of detectors appeared in previous embodiment. The primary assembly 10c aligns the laser diode 16, the lens 17, the etalon device 19, and detectors (22a, 22b) on the surface 24c along the predetermined axis. In this configuration, the detector 22a faces the lens 17, while the detector 22b opposes the etalon device 19. Two detectors 22a and 22b are independent relative to each other. The shape of the light sensitive region of respective detectors (22a, 22b) is same as the shape previously explained.

The etalon device 19 has a flat top surface 19g to place the detector 22a thereon. This configuration, in which a distance from the laser diode to the detector 22a is shortened compared to the case in FIG. 6, enhances the magnitude of the received light. The size and its curvature of the lens 17 are determined by the condition that the detector 22a receives collimated light from the lens.

In this embodiment, a beam C1 emitted from the facet 16a enters the optical fiber 14 through two lenses 32a and 38a. Another beam C2 emitted from the facet 16b enters the lens 17 and is converted to collimated beams C3 and C4. The beam C4 directly enters the detector 22a; therefore, the beam C4 only reflects the characteristic of the laser diode 16. On the other hand, since another beam C3 enters the detector 22b through the etalon device 19, the output from the detector 22a involves the contribution of the laser diode 16 and the etalon device 19.

FOURTH EMBODIMENT

Figure 11:
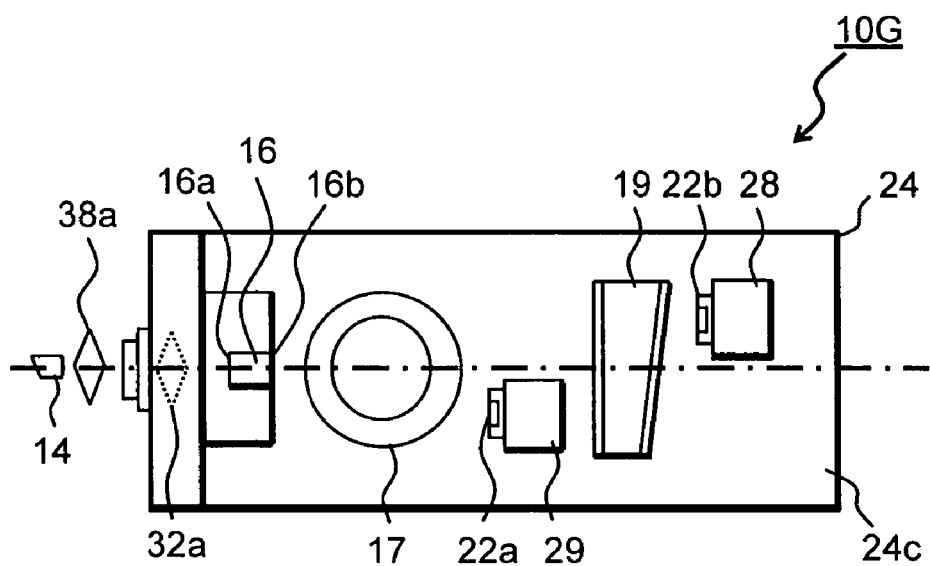
FIG. 11 is a plan view showing the sixth embodiment of the present invention.

FIG. 11 is a plan view showing sixth embodiment of the invention. In this embodiment, the first detector 22a is placed between the lens 17 and the wedge etalon device 19, while the second detector 22b is disposed behind the wedge etalon device 19, both through the sub-mount 28 and 29, respectively.

In this arrangement, the first detector 22a receives portion of light emitted from the second facet 16b of the laser diode 16, while the second detector 22b detects light emitted from the laser diode 16 via the lens 17 and the etalon device 19. Therefore, the first output derived from the first detector 22a may be used for the control of the output power of the laser diode 16, while the output from the second detector 22b may be served for the control of the output wavelength thereof, because the former does not reflect the transmission spectrum of the wedge etalon device, while the latter includes it.

FIFTH EMBODIMENT

Figure 8A:
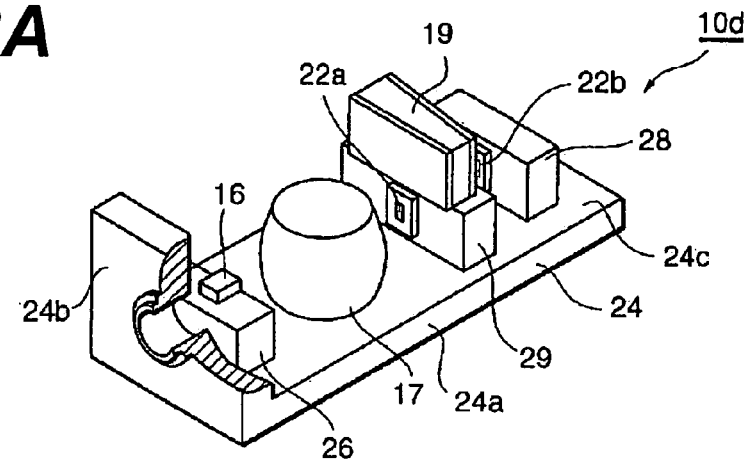
FIG. 8A shows a perspective view of the fourth embodiment.
Figure 8B:
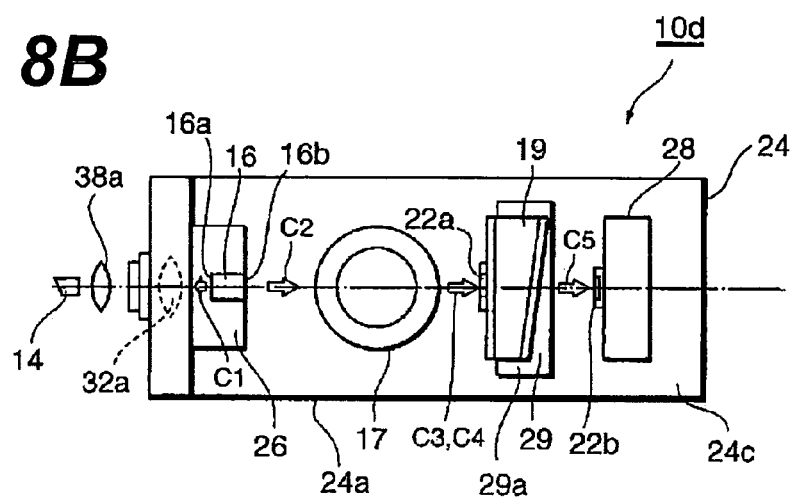
FIG. 8B is a plane view and FIG. 8C is a side view of the embodiment.
Figure 8C:
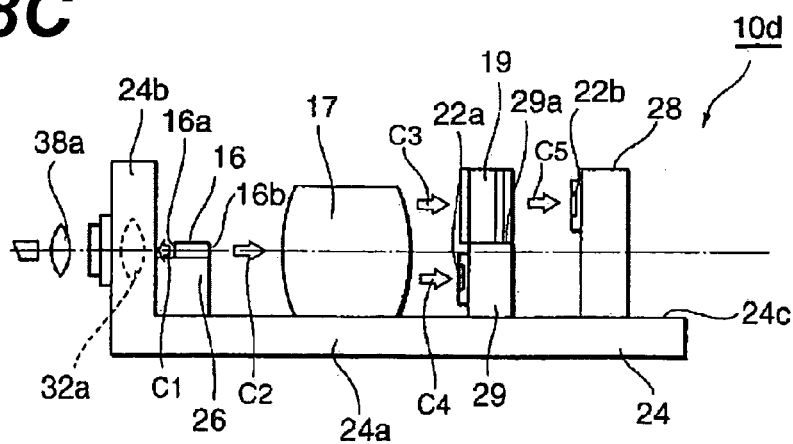

FIG. 8 shows the fourth embodiment of the invention. In this embodiment, the primary assembly contains a member 29 for mounting the etalon device 19 thereon and for attaching the detector 22a thereto. To adjust the wavelength, to which the laser diode oscillation is fixed, is realized by sliding the etalon device on the surface 29a of the member. Other compositions of the assembly are same with the case of the third embodiment.

SIXTH EMBODIMENT

Figure 9A:
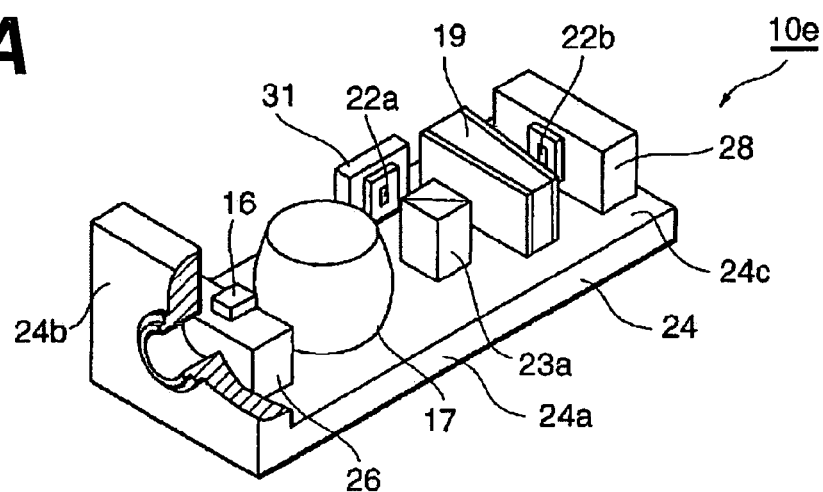
FIG. 9A is a perspective view of the fifth embodiment and FIG. 9B is a place view of the fifth embodiment.
Figure 9B:
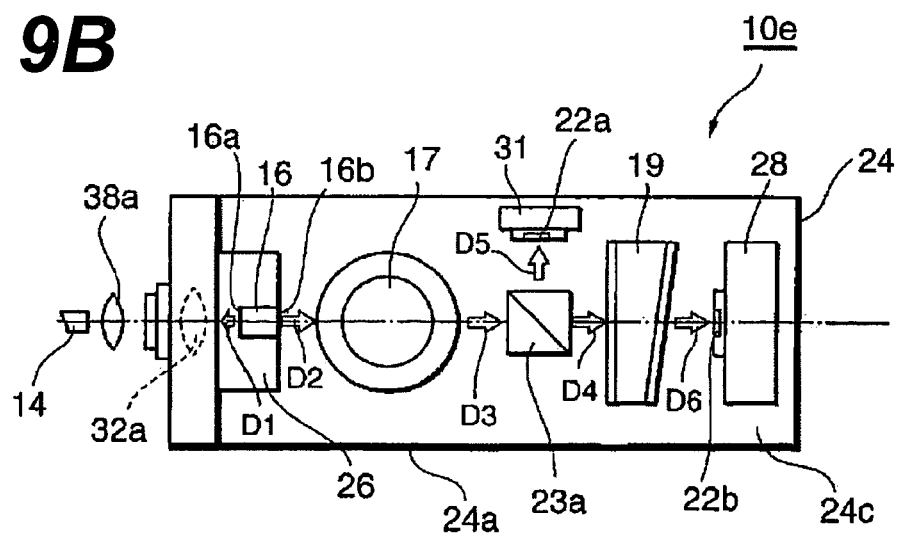

FIG. 9 shows the fifth embodiment of the invention. This embodiment contains the laser diode 16, the lens 17, the beam splitter 23a, the etalon device, and two detectors (22a, 22b) on the auxiliary member 24. The beam splitter 23a optically couples to the lens and the detector 22a attached to another member 31. Light from the splitter 23a reaches the detector 22b through the etalon device 19.

In this arrangement, a beam D1 emitted from the facet 16a enters the optical fiber 14 through two lenses 32a and 38a. Another beam D2 emitted from the facet 16b enters the lens 17 and is converted to collimated beam D3 by the lens. The splitter 23a divides the collimated beam D3 into two beams D4 and D5. The beam D5 reaches the detector 22a without passing through the etalon device, so the beam D5 reflects the spectrum only of the laser diode 16. On the other hand, one of the divided beams D4 reaches the detector 22b through the etalon device, so the output from the detector 22b contains the spectrum both of the laser diode 16 and the etalon device 19.

SEVENTH EMBODIMENT

Embodiments previously described utilize light emitted from the facet 16b of the laser diode to control the wavelength and the output power of the laser. Another example will be explained in which light from the front facet 16b of the laser diode is referred for the control.

Figure 10A:
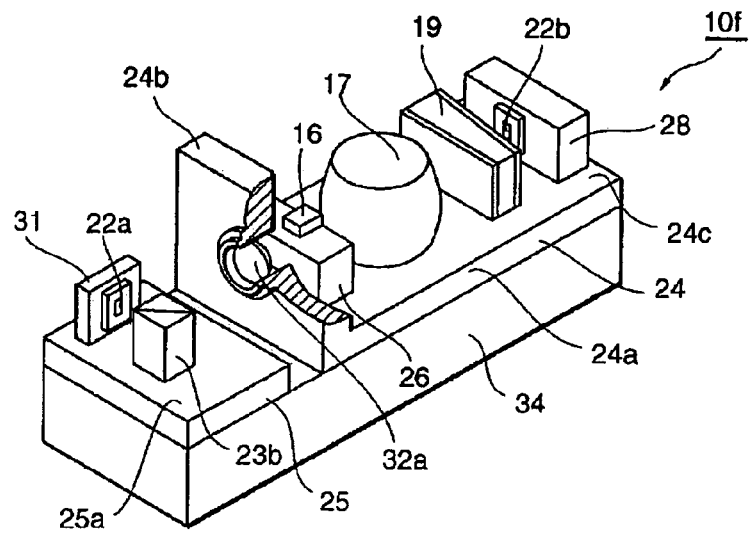
FIG. 10A shows a perspective view of the sixth embodiment.
Figure 10B:
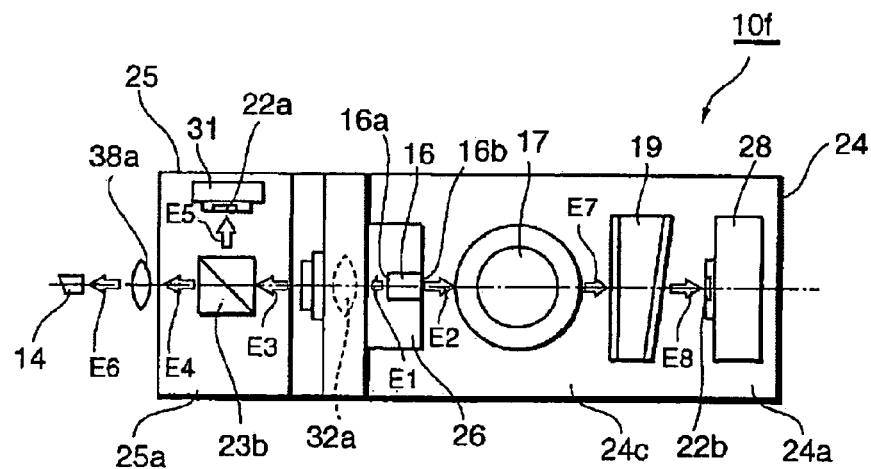
FIG. 10B is a plane view.

In FIG. 10, the primary assembly of the module contains the detector 22a on the front side of the laser diode 16 and the detector 22b on the backside of the laser 16. The thermoelectric cooler 34 place an auxiliary member 24 and another member 25 thereon. The laser diode 16, the lens 17, the etalon device, and the detector 22b are mounted on the auxiliary member 24. The splitter 23b and the detector 22a are mounted on the member 25. The splitter 23b optically couples to the laser diode 16 through the lens 32a, the fiber 14, and the detector 22a. The back facet 16b of the laser diode optically couples to the detector 22a through the etalon device 19.

A light beam E1 emitted from the facet 16a enters the splitter through the lens 32a. The splitter 23b divides the beam E1 into two beams E4 and E5. The beam E5 enters the detector 22a, in which only the spectrum of the laser diode is contained. Another beam E4 enters the fiber 14 through the lens 38a. On the other hand, the beam E2 emitted from the back facet 16b enters the lens 17 and is converted into the collimated beam E7. The beam E7 reaches the detector 22b through the etalon device; therefore, the output from the detector 22b contains the spectrum both of the laser diode and the etalon device.

Since various embodiments previously mentioned use a wedge type etalon device not a parallel-plate type etalon device for the wavelength discriminate device, it enables to reduce a region to place the etalon device. In the parallel-plate etalon device, a free spectral rang, which means a period appeared in the transmittance spectrum, is determined by an angle of incident light. Since the free spectral range closely relates to the wavelength interval, it is inevitable to rotate the etalon device for adjusting the free spectral range and to obtain a desired wavelength interval. Therefore, it requires for the etalon device to rotate in the case of the parallel plate type. On the other hand, only sliding adjusts the wavelength in the wedge type etalon device.

From the invention thus described, it will be obvious that the invention may be varied in many ways. Although various types of auxiliary member are described, other combination of members are considered to be within the scope of the present invention. The present invention is not restricted to the L-shaped member. Further, the light-receiving device may integrally contain two detectors or may be discrete device independently to each other. Such variations are not to be regarded as a departure from the spirit and scope of the invention, and all such modifications as would be obvious to one skilled in the art are intended for inclusion within the scope of the following claims.

What is claimed is:

1. A light-emitting module comprising:
a semiconductor light-emitting device for emitting light with a predetermined magnitude under a predetermined temperature, said light-emitting device having a first facet and a second facet;
an etalon device optically coupling to said second facet of said semiconductor light-emitting device;
a first optical detector for outputting a first output, said first optical detector being optically coupled with said semiconductor light-emitting device without coupling to said etalon device; and
a second optical detector for outputting a second output, said second optical detector being optically coupled with said semiconductor light-emitting device through said etalon device,
wherein said first optical detector is disposed between said semiconductor light-emitting device and said etalon device such that said first optical detector receives said light emitted from said light-emitting device without said light having been split before being received by said first optical detector.

2. The light-emitting module according to claim 1, further including a lens provided for collimating said light emitted from said light-emitting device, said lens being disposed between said second facet of said semiconductor device and said etalon device, wherein said first optical detector is disposed between said lens and said etalon device.

3. The light-emitting module according to claim 2, wherein said lens has a flat top surface.

4. The light-emitting module according to claim 1, wherein said etalon device is a wedge type etalon device.

5. The light-emitting module according to claim 4, wherein said wedge etalon device mounts said first optical detector thereon.

6. The light-emitting module according to claim 4, wherein said first detector mounts said wedge etalon device thereon.

7. The light-emitting module according to claim 4, further includes a beam splitter for splitting said light emitted from said semiconductor light-emitting device into a first beam and a second beam, said beam splitter being disposed between said second facet and said wedge etalon device, said first detector detecting said first beam and said second detector detecting said second beam.

8. The light-emitting module according to claim 4, further include a beam splitter for splitting said light emitted from said semiconductor light-emitting device into a first beam and a second beam, said splitter being optically coupled with said first facet of said semiconductor device, and said first detector detecting said first beam.

9. The light-emitting module according to claim 4, further includes a thermoelectric cooler for controlling said predetermined temperature of said semiconductor light-emitting device based on said second output provided from said second detector.

10. The light-emitting module according to claim 4, wherein said predetermined magnitude of light emitted from said semiconductor light-emitting device is controlled based on said first output from said first optical detector.

11. The light-emitting module according to claim 1, wherein said first detector and said second detector are formed integrally.

12. A light-emitting module comprising:
- a semiconductor light-emitting device for emitting light with a predetermined magnitude under a predetermined temperature;
- an etalon device optically coupled with said semiconductor light-emitting device;
- a lens disposed between said light-emitting device and said etalon device, said lens collimating said light emitted from said semiconductor device;
- a first optical detector disposed between said lens and said etalon device to output a first output by receiving directly said light emitted from said light-emitting device and collimated with said lens;
- a second optical detector disposed behind said etalon device to output a second output by receiving light collimated with said lens and transmitted through said etalon device;
- a first optical axis connecting said lens with said first optical detector without passing through said etalon device; and
- a second optical axis connecting said lens with said second optical detector and passing through said etalon device;
- wherein said first optical axis extends substantially in parallel to said second optical axis.

13. The light-emitting module according to claim 12, wherein said light emitting device provides a first facet, a second facet and an optical axis connecting said first facet with said second facet, and wherein said optical axis of said light-emitting device is substantially in parallel to said first optical axis and said second optical axis.

* * * * *